United States Patent
Burgener, II et al.

(10) Patent No.: US 7,675,133 B2
(45) Date of Patent: Mar. 9, 2010

(54) PERSISTENT P-TYPE GROUP II-IV SEMICONDUCTORS

(76) Inventors: Robert H. Burgener, II, 418 W. Winchester St., Murray, UT (US) 84107; Roger L. Felix, 2391 N. 180 West, Pleasant Grove, UT (US) 84062; Gary M. Renlund, 2094 Worchester Dr., Salt Lake City, UT (US) 84121

( * ) Notice: Subject to any disclaimer, the term of this patent is extended or adjusted under 35 U.S.C. 154(b) by 0 days.

(21) Appl. No.: 11/165,848

(22) Filed: Jun. 17, 2005

(65) Prior Publication Data

US 2005/0285138 A1    Dec. 29, 2005

Related U.S. Application Data

(60) Provisional application No. 60/580,454, filed on Jun. 17, 2004.

(51) Int. Cl.
*H01L 31/00* (2006.01)
(52) U.S. Cl. .................. 257/442; 257/101; 257/102; 257/103; 257/614; 257/E21.135
(58) Field of Classification Search .............. None
See application file for complete search history.

(56) References Cited

U.S. PATENT DOCUMENTS

| | | | |
|---|---|---|---|
| 3,664,867 A | 5/1972 | Galli et al. | |
| 3,864,725 A | 2/1975 | Merrin | |
| 4,399,441 A | 8/1983 | Vaughn et al. | |
| 5,331,655 A | 7/1994 | Harder et al. | |
| 6,057,561 A | 5/2000 | Kayasaki et al. | |
| 6,291,085 B1 | 9/2001 | White et al. | |
| 6,342,313 B1 | 1/2002 | White et al. | |
| 6,410,162 B1 | 6/2002 | White et al. | |
| 6,475,825 B2 | 11/2002 | White et al. | |
| 6,527,858 B1 * | 3/2003 | Yoshida et al. | 117/108 |
| 6,589,362 B2 | 7/2003 | Haga | |
| 6,610,141 B2 | 8/2003 | White et al. | |
| 6,617,183 B2 | 9/2003 | Kadota et al. | |

(Continued)

FOREIGN PATENT DOCUMENTS

EP    1219731 A1    7/2002

(Continued)

OTHER PUBLICATIONS

Aulbur, W.; Density Functional Theory: Basic Ideas & Applications; Ohio State University.

(Continued)

*Primary Examiner*—Wai-Sing Louie
(74) *Attorney, Agent, or Firm*—Kirton & McConkie; Evan R. Witt

(57) ABSTRACT

A persistent p-type group II-VI semiconductor material is disclosed containing atoms of group II elements, atoms of group VI elements, and a p-type dopant which replaces atoms of the group VI element in the semiconductor material. The p-type dopant has a negative oxidation state. The p-type dopant causes formation of vacancies of atoms of the group II element in the semiconductor material. Fabrication methods and solid state devices containing the group II-VI semiconductor material are disclosed.

20 Claims, 7 Drawing Sheets

U.S. PATENT DOCUMENTS

| | | | |
|---|---|---|---|
| 6,624,441 | B2 | 9/2003 | Cantwell et al. |
| 6,664,565 | B1 | 12/2003 | Sano et al. |
| 6,673,478 | B2 | 1/2004 | Kato et al. |
| 6,707,074 | B2 | 3/2004 | Yoshii et al. |
| 6,733,895 | B2 | 5/2004 | Kadota et al. |
| 6,838,308 | B2 | 1/2005 | Haga |
| 7,132,691 | B1 * | 11/2006 | Tanabe et al. ............ 257/79 |
| 2003/0226499 | A1 | 12/2003 | Teherani |
| 2004/0061114 | A1 | 4/2004 | Yan et al. |
| 2004/0099876 | A1 | 5/2004 | Niki et al. |
| 2004/0108505 | A1 | 6/2004 | Tuller et al. |
| 2004/0175860 | A1 | 9/2004 | Park et al. |

FOREIGN PATENT DOCUMENTS

| | | |
|---|---|---|
| JP | 2002068890 | 3/2002 |

OTHER PUBLICATIONS

Look, D.C., and Claflin, B.; P-type doping and devices based on ZnO; Aug. 2003; Wiley-VCH Verlag GmbH & Co.

Zunger, A.; Practical Doping Principles; NCPV and Solar Program Review Meeting 2003; pp. 831-835.

Zhang, S.B., Wei, S.H., and Zunger, A.; Intrinsic $n$-type versus $p$-type doping asymmetry and the defect physics of ZnO; Physical Review B; Jan. 31, 2001; pp. 075205-1-075205-7; vol. 63; The American Physical Society.

Limpijumnong, S., Zhang, S.B., Wei, S-H., and Park C.H; Doping by Large-Size-Mismatched Impurities: The Microscopic Origin of Arsenic- or Antimony-Doped $p$-Type Zinc Oxide; Physical Review Letters; Apr. 16, 2004; vol. 92, No. 15; The American Physical Society.

Yamamoto, T., and Katayama-Yoshida, H.; Solution Using a Codoping Method to *Unipolarity* for the Fabrication of $p$-Type ZnO; Japanese Journal of Applied Physics; Feb. 15, 1999; pp. L 166-L 169; vol. 38; Japanese Journal of Applied Physics Publication Board.

Park, C.H., Zhang, S.B., and Wei, S-H,; Origin of $p$-type doping difficulty in ZnO: The impurity perspective; Physical Review B; Aug. 5, 2002; pp. 073202-1-073202-3; vol.66; The American Physical Society.

Tsukazaki, A., Atsushi, T., Ohtomo, A., Onuma, T., Ohtani, M., Makino, T., et al; Repeated temperature modulation epitaxy for p-type doping and light-emitting diode based on ZnO; Nature Materials; Jan. 2005; pp. 42-46; vol. 4; Nature Publishing Group.

Nonaka, M., Matsushima, S., Mizuno, M., and Kobayashi, K.; Electronic Structure of Group III Elements Dopes into ZnO by Using Molecular Orbital Calculation; Chemistry Letters 2002; Feb. 20, 2002; pp. 580-581; The Chemical Society of Japan.

Wang, L.G., and Zunger, A.; Cluster-Doping Approach for Wide-Gap Semiconductors: The Case of $p$-type ZnO; Physical Review Letters; Jun. 27, 2003; pp. 256401-1-256401-4; vol. 90, No. 25; The American Physical Society.

Norton, D.P., Heo, Y.W., Ivill, M.P., Ip, K., Pearton, S.J., et al; ZnO: growth, doping and processing; Materialstoday; Jun. 2004; Elsevier Ltd.

Lee, E-C., Kim, Y.-S., Jin, Y.-G., and Chang, K.J.; First-Principles Study of $p$-Type Doping and Codoping in ZnO; Journal of the Korean Physical Society; Dec. 2001; pp. S23-S26; vol. 39.

Morhain, C., Teisseire, M., Vezian, S., Vigue, F., Raymond, F., et al; Spectroscopy of Excitons, Bound Excitons and Impurities in h-ZnO Epilayers; Sep. 30, 2001; pp. 881-885; vol. 229, No. 2; Wiley VCH; Berlin.

Bandyopadhyay, S., Paul, G.K., Roy, R., Sen, S.K., and Sen, S; Study of structural and electrical properties of grain-boundary modified ZnO films prepared by sol-gel technique; Materials Chemistry and Physics; May 17, 2001; pp. 83-91; vol. 74; Elsevier Science B.V.

Wilkinson, J., Xiong, G., Ucer, K.B., and Williams, R.T.; Lifetime and Oscillator Strength of Excitonic Luminescence in Zinc Oxide; Department of Physics, Wake Forest University, Winston-Salem, NC.

Kobayashi, A., Sankey, O.F., and Dow, J.D. Deep energy levels of defects in the wurtzite semiconductors AIN, CdS, CdSe, and ZnO; Physical Review B; Jul. 15, 1983; pp. 946-956; vol. 28, No. 2; The American Physical Society.

Daneu, N., Reenik, A., and Bernik, S.; Grain Growth Control in $Sb_2O_3$-Doped Zinc Oxide; Journal of the American Ceramic Society; 2003; pp. 1379-1384; vol. 86, No. 8.

Ohyama, M.; Sol-Gel Preparation of Transparent and Conductive Aluminum-Doped Zinc Oxide Films with Highly Preferential Crystal Orientation; Journal of the American Ceramic Society; 1998; pp. 1622-1632; vol. 81, No. 6.

Duan, X.L., Yuan, D.R., Cheng, X.F., Sun, H.Q., Sun, Z.H., et al; Microstructure and Properties of $Co^2$: $ZnAl_2O_4/SiO_2$ Nanocomposite Glasses Prepared by Sol-Gel Method; Journal of the American Ceramic Society; 2005; pp. 399-403; vol. 88, No. 2.

Sohn, K.S., Hwang; D.K., and Myoung, J.M.; Time Integrated/Resolved Photoluminescense of ZnO Films Deposited on Sapphire and GaAs; Japanese Journal of Applied Physics; Dec. 2003; pp. 7376-7378; The Japan Society of Applied Physics.

Sun, X.W.; Optical properties of epitaxially grown zinc oxide films on sapphire by pulsed laser deposition; Journal of Applied Physics; Jul. 1, 1999; pp. 408-411; vol. 86, No. 1; American Institute of Physics.

Burden, A.P., Bishop, H.E., Brierley, M., Friday, J.M., Hood, C., et al.; Incorporating consumer-priced field emitting inks into arrays of triode devices; Solid State Electronics; 2001; pp. 987-996; vol. 45; Printable Field Emitters Ltd.

Minami, T. Miyata, T., Shirai, T., and Nakatani, T.; Electroluminescent Oxide Phosphor Thin Films Prepared by a Sol-gel Process; Mat Res. Soc. Symp. Proc.; 2000; pp. Q4.3.1-Q4.3.6; vol. 621; Materials Research Society.

Qiu, C., Chen, H., Wong, M., and Kwok, H.S.; Dependence of the Current and Power Efficiencies of organic Light-Emitting Diode on the Thickness of the Constituent Organic Layers; IEEE Transactions On Electron Devices; Sep. 2001; pp. 2131-2137; vol. 48; IEEE.

Matsuda, T., Kawabe, M., Iwata, H. and Ohzone, T.; Visible Electroluminescence from MOS Capacitors with Si-Implanted $SiO_2$; IEICE Trans. Electron.; Sep. 11, 2002; pp. 1895-1904; vol. E85-C, No. 11.

Ong, H.C., Li, A.S.K, and Du, G.T.; Depth profiling of ZnO thin films by cathodoluminescence; Applied Physics Letters; Apr. 30, 2001; pp. 2667-2669; vol. 78, No. 18; American Institute of Physics.

Washington, P.L., Ong, H.C., Dai, J.Y., and Chang, R.P.H.; Determination of the optical constants of zinc oxide thin films by spectroscopic ellipsometry; Applied Physics Letter; Jun. 22, 1998; pp. 3261-3263; vol. 72, No. 25; American Institute of Physics.

Sekiguchi, T., Ohashi, N., and Yamane, H.; Cathodoluminescence Study on ZnO and GaN; Solid State Phenomena; 1998; pp. 171-182; vols. 63-64; Scitec Publications; Switzerland.

Kouyate, D., Ronfard-Haret, J.-C., and Kossanyi, J.; Photo- and electro-luminescence of rare earth-doped semiconducting zinc oxide electrodes: Emission from both the dopant and the support; Journal of Luminescence; 1991; pp. 205-210; vol. 50; Elsevier Science Publishers B.V.

Kossanyi, J., Kouyate, D., Pouliquen, J., Ronfard-Haret, J.C. Valat, P., et al.; Photoluminescence of Semiconducting Zinc Oxide Containing Rare Earth Ions Impurities; Journal of Luminescence; 1990; pp. 17-24; vol. 46; Elsevier Science Publishers B.V. (north-Holland).

Wang, Y.G., Lau, S.P., Lee, H.W., Vu, S.F., Tay, B.K., et al.; Photoluminescence study of ZnO films prepared by thermal oxidation of Zn metallic films in air; Journal of Applied Physics; Jul. 1, 2003; pp. 354-358; vol. 94, No. 1; American Institute of Physics.

Yu, S.F., Yuen, C., Lau, S.P., Wang, Y.G., Lee, H.W., et al.; Ultraviolet amplified spontaneous emission from zinc oxide ridge waveguides on silicon substrate; Applied Physics Letter; Nov. 24, 2003; pp. 4288-4290; vol. 83, No. 21; American Institute of Physics.

Xiong, G., Wilkinson, J., Lyles, J., Ucer, K.B., and Williams, R.T.; Luminescence and stimulated emission in zinc oxide nanoparticles, films, and crystals.

Ong, H.C., Dai, J.Y., and Du, G.T.; Studies of electronic structure of ZnO grain boundary and its proximity by using spatially resolved electron energy loss spectroscopy; Applied Physics Letter; Jul. 8, 2002; pp. 277-279; vol. 81, No. 2; Amencan Institute of Physics.

Agne, T., Guan, Z., Li, X.M., Wolf, H., and Wichert, T.; Incorporation of the Donor Indium in Nanocrystalline ZnO; phys. stat. sol.; 2002; pp. 819-823; vol. 229; Wiley-VCH Verlag Berlin GmbH; Berlin.

Qadri, S.B., Kim, H., Horwitz, J.S., and Chrisey, D.B.; Transparent conducting films of ZnO-ZrO$_2$: Structure and properties; Journal of Applied Physics; Dec. 1, 2000; pp. 6564-6566; vol. 88, No. 11; American Institute of Physics.

Han, J., Mantas, P.Q., and Senos, A.M.R.; Grain growth in Mn-doped ZnO; Journal of the European Ceramic Society; 2000; 2753-2758; vol. 20.

Jin, Y., Zhang, B., Yang, S., Wang, Y., Chen, J., et al.; Room temperature UV emission of Mg$_x$Zn$_{1-x}$O films; Solid State Communications; 2001; pp. 409-413; vol. 119; Elsevier Science Ltd.

Petrik, N. G., Alexandrov, A.B., and Vall, A.I.; Interfacial Energy Transfer during Gamma Radiolysis of Water on the Surface of ZrO$_2$ and Some Other Oxides; J. Phys. Chem. B; 2001; pp. 5935-5944; vol. 105; American Chemical Society.

Counio, G., Esnouf, S., Gacoin, T., and Boilot, J.-P.; CdS:Mn Nanocrystals in Transparent Xerogel Matrices: Synthesis and Luminescence Properties; J. Phys. Chem.; 1996; pp. 20021-20026; vol. 100; American Chemical Society.

Stravrev, K. Kynev, K. St. Nikolov, G., and Dyakovitch, V.A.; Semiempirical Assignment of the Electron Transitions in Manganese(II)-Doped II-VI Compounds; J. Phys. Chem. Solids; 1987; pp. 841-844; vol. 48, No. 9; Pergamon Journals Ltd.

Falcony, C., Ortiz, A., Dominguez, J.M., Farias, M.H., Cota-Araiza, L et al.; Luminescent Characteristics of Tb Doped Al$_2$O$_3$ Films Deposited by Spray Pyrolysis; J. Electrochem Soc.; Jan. 1992; pp. 267-271; vol. 139, No. 1; The Electrochemical Society, Inc.

Bachir, S., Kossanyi, J., Sandouly, C., Valat, P., and Ronfard-Haret, J.C.; Electroluminescence of Dy$^{3x}$ and Sm$^{3x}$ Ions in Polycrystalline Semiconducting Zinc Oxide; J. Phys. Chem; 1995; pp. 5674-5679; vol. 99; American Chemical Society.

Bachir, S., Kossanyi, J., and Ronfard-Haret, J.C.; Electroluminescence of Ho$^{3x}$ Ions In a ZnO Varistor-Type Structure; Solid State Communications; 1993; pp. 859-863; vol. 89, No. 10; Elsevier Science Ltd.; Great Britain.

Chakrabarti, S., Ganguli, D., Chaudhuri, S., and Pal, A.K.; Crystalline magnesium oxide films on soda lime glass by sol-gel processing; Meterials Letters; May 2002; pp. 120-123; vol. 54; Elsevier Science B.V.

Arkles, B.; Commercial Applications of Sol-Gel-Derived Hybrid Materials; MRS Bulletin; May 2001; pp. 402-407.

Murray, C.E., Noyan, I.C., and Mooney, P.M.; Mapping of strain fields about thin film structures using x-raymicrodiffraction; Applied Physics Letters; Nov. 17, 2003; pp. 4163-4165; vol. 83, No. 20; American Institute of Physics.

Modena, S., Soraru, G.D., Blum, Y. And Raj. R.; Passive Oxidation of an Effluent System: The Case of Polymer-Derived SICO; Journal of the American Ceramic Society; 2005; pp. 339-345; vol. 88.

Noyan, I.C., Wang, P.-C., Kaldor, S.K., and Jordan-Sweet, J.L.; Deformation field in single-crystal fields semiconductor substrates caused by metallization features; Applied Physics Letters; Apr. 19, 1999; pp. 2352-2354; vol. 74, No. 16; American Institute of Physics.

Noyan, I.C., Jordan-Sweet, J., Liniger, E.G., and Kaldor, S.K; Characterization of substrate-thin-film interfaces with x-ray microdiffraction; Applied Physics Letters; Jun. 22, 1998; pp. 3338-3340; vol. 72, No. 25; American Institute of Physics.

Tuller, H.L.; ZnO Grain Boundaries: Electrical Activity and Diffusion; Journal of Electroceramics; 1999; pp. 33-40; vol. 4:S1; Kluwer Academic Publishers; Boston.

Westin, G., Ekstrand, A., Nygren, M., Osterlund, R., and Merkelbach. P.; Preparation of ZnO-based Varistors γ the Sol-Gel Technique; J. Mater. Chem.; 1994; pp. 615-621; vol. 4.

Wang, M., Yang, X., and Wang., F.; Properties of Sensitive Materials Mainly Composed of ZnO; J. Mater. Sci. Technol.; 2000; p. 204; vol. 16, No. 2.

Baptista, J.L., and Mantas, P.Q.; High Temperature Characterization of Electrical Barriers in ZnO Varistors; Journal of Electroceramics; 2000; pp. 215-224; vol. 4:1; Kluwer Academic Publishers; The Netherlands.

Brankovic, Z., Brankovic, G., Poleti, D., and Varela, J.A.; Structural and electrical properties of ZnO varistors containing different spinel phases; Ceramics International; 2001; pp. 115-122; vol. 27; Elsevier Science Ltd. And Techna S.r.l.

Tanaka, A., and Mukae, K.; Evaluation of Single Grain Boundaries in ZnO: Rare-Earth Varistor by Micro-Electrodes; Key Engineering Materials; 1999; pp. 235-240; vols. 157-158; Trans Tech Publications, Switzerland; CSJ Series-Publications of the Ceramic Society of Japan vol. 1, The Ceramic Society of Japan.

Pandey, R., Jaffe, J.E., and Kunz, A.B., *Ab initio* band-structure calculations for alkaline-earth oxides and sulfides; Physical Review B; Apr. 15, 1991; pp. 9228-9237; vol. 43, No. 11; The American Physical Society.

Canney, S.A., Sashin, V.A., Ford, M.J., and Kheifets, A.S.; Electronic band structure of magnesium and magnesium oxide: experiment and theory; J. Phys. Condens. Matter; 1999; pp. 7507-7522; vol. 11; IOP Publishing Ltd.

Yamasaki, A. and Fujiwara, T.; Electronic structure of the *MO* oxides (*M*=Mg, Ca, Ti, V) in the GW approximation; Physical Review B; 2002; pp. 245108-1-245108-9; vol. 66; The American Physical Society.

Mikajlo, E.A., Sashin, V.A., Nixon, K.L., Seoule De Bas, B. Dorsett, H.E., and Ford, M.J.; Band Structures of the Group I and II Oxides: Using EMS Measurements as a of Theoretical Models.

Johnson, P.D.; Some Optical Properties of MgO in the Vacuum Ultraviolet; Physical Review; May 15, 1954; pp. 845-846; vol. 94, No. 4.

Narazaki, A., Tanaka, K, Hirao, K., Hashimoto, T., Nasu, H., et al.; IR and XPS Studies on the Surface Structure of Poled ZnO-TeO$_2$ Glasses with Second-Order Nonlinearity; Journal of the American Ceramic Society; 2001; pp. 214-217; vol. 84.

Schonberger, U., and Aryasetiawan, F.; Bulk and surface electronic structures of MgO; Physical Review B; Sep. 15, 1995; pp. 8788-8793; vol. 52, No. 12; The American Physical Society.

Gonzalez, R., Chen, Y., Sebek, R.M., Williams, G.P., Williams, R.T., et al.; Properties of the 800-nm luminescence band in neutron-irradiated magnesium oxide crystals; Physical Review B; Mar. 1, 1991; pp. 5228-5233; vol. 43, No. 7; The American Physical Society.

Balzer, B., Hagemeister, M., Kocher, P., and Ludwig, J.G.; Mechanical Strength and Microstructure of Zinc Oxide Varistor Ceramics; Journal of the American Ceramic Society; 2004; pp. 1932-1938; vol. 87.

Sheng, H., Emanetoglu, N. W., Muthukumar, S., Yakshinskiy, B.V., Feng, S., et al.; Ta/Au Ohmic Contacts to n_type ZnO; Journal of Electronic Materials; 2003; p. 935; vol. 32, No. 9.

Sheng, H., Emanetoglu, N. W., Muthukumar, S., Feng, S., and Lu, L.; Nonalloyed Al Ohmic Contacts to Mg$_x$Zn$_{12x}$O; Journal of Electronic Materials; 2002; p. 811; vol. 31, No. 7.

Xiong, G., Wilkinson, J., Mischuck, B., Tuzemen, S., Ucer, K.B., et al; Control of p- and n-type conductivity in sputter deposition of undoped ZnO; Applied Physics Letters; Feb. 18, 2002; p. 1195; vol. 80, No. 7.

Yamamoto, T., and Katayama-Yoshida, H.; Unipolarity of ZnO with a wide-band gap and its solution using codoping method; Journal of Crystal Growth; 2000; pp. 552-555; vol. 214/215; Elsevier Science B.V.

Chang, R., Marks, T. Mason,. T., and Poeppelmeir, K.; n/p-Type Transparent Conductors; pp. 259-260.

Olorunyolemi, T., Birnboim, A., Carmel, Y., Wilson, O.C., Lloyd, I.K.; Thermal Conductivity of Zinc Oxide: From Green to Sintered State; Journal of the American Ceramic Society; 2002; pp. 1249-1253; vol. 85.

Martin, L.P., and Rosen, M.; Correlation between Surface Area Reduction and Ultrasonic Velocity in Sintered Zinc Oxide Powders; Journal of the American Ceramic Society; 1997; pp. 839-846; vol. 80.

Wilkinson, J., Xiong, G., Ucer, K.B., and Williams, R.T.; Lifetime and Oscillator Strength of Excitonic Luminescence in Zinc Oxide.

Sekiguchi, T., Haga, K., and Inaba, K.; ZnO films grown under the oxygen-rich condition; Journal of Crystal Growth; 2000; pp. 68-71; vol. 214-215; Elsevier Science-B.V.

Van De Walle, C.G.; Hydrogen as a Cause of Doping in Zinc Oxide; Physical Review Letters; Jul. 31, 2000; pp. 1012-1015; vol. 85, No. 5; The American Physical Society.

Kato. H., Sano, M., Miyamoto, K, and Yao, T.; Effect of O/Zn on Flux Ratio on Crystalline Quality of ZnO Films Grown by Plasma-Assisted Molecular Beam Epitaxy; Japanese Journal of Applied Physics; 2003; pp. 2241-2244; vol. 42; The Japan Society of Applied Physics.

Nakahara, K., Tanabe, T., Takasu, H., Fons, P., Iwata, K., et al.; Growth of undoped ZnO Films with Improved Electrical Properties by Radical Source Molecular Beam Epitaxy; Japanese Journal of Applied Physics; 2001; pp. 250-254; vol. 40; The Japan Society of Applied Physics.

Wang, X., Du, G., Gu, C., Jia, J., Li, X., et al.; Two-step growth of ZnO thin films on diamond/Si low-pressure metal-organic chemical vapour deposition; J. Phys. D: Appl. Phys.; 2002; pp. L74-L76; vol. 35; IOP Publishing Ltd., United Kingdom.

Han, J., Mantas, P.Q., and Senos, A.M.R.; Grain growth in Mn-doped ZnO; Journal of the European Seramic Society; 2000; pp. 2753-2758; vol. 20; Elsevier Science Ltd.

Fons, P., Iwata, K., Niki, S., Yamada, A., Matsubara, K, et al.; Uniaxial locked growth of high-quality epitaxial ZnO films on $\alpha$-$Al_2O_3$; Journal of Crystal Growth; 2000; pp. 532-536; vol. 209; Elsevier Science B.V.

Haga, K., Kamidaira, M., Kashiwaba, Y., Sekiguchi, T., Watanabe, H.; ZnO thin films prepared by remote plasma-enhanced CVD method; Journal of Crystal Growth; 2000; pp. 77-80; vol. 214/215; Elsevier Science B.V.

Fons, P., Iwata, K; Niki, S., Yamada, A., and Matsubara, K.; Growth of high-quality epitaxial ZnO films on $\alpha$-$A_2O_3$; Journal of Crystal Growth; 1999; pp. 627-632; vol. 201/202; Elsevier Science B.V.

Myoung, J-M., Yoon, W-H., Lee, D-H., Yun, I., Bae, S-H., et al.; Effects of Thickness Variation of Properties of ZnO Thin Films Grown by Pulsed Laser Deposition; Japanese Journal of Applied Physics; 2002; pp. 28-31; vol. 41; The Japan Society of Applied Physics.

Yuldashev, S.U., Panin, G.N., Choi, S.W., Yalishev, V.S., Nosova, L.A. et al.; Electrical and Optical Properties of ZnO Films Grown on GaAs Substrates; Jpn. J. Appl. Phys; 2003; pp. 3333-3336; vol. 42; The Japan Society of Applied Physics.

Nonaka, M., Matsushima, S., Mizuno, M., Kobayashi, K.; Electronic Structure of Group III Elements Doped into ZnO by Using Molecular Orbital Calculation; Chemistry Letters; 2002; pp. 580-581; The Chemical Society of Japan.

Lin, G-R., and Wang, S-C.; Comparison of High-Resistivity ZnO Films Sputtered on Different Substrates; Japanese Journal of Applied Physics; 2002; pp. L398-L401; vol. 41; The Japan Society of Applied Physics.

Mantas, P.Q., and Baptista, J.L.; The Barrier Height Formation in ZnO Varistors; Journal of the European Ceramic Society; 1995; pp. 605-615; vol. 15; Elsevier Science Limited, Great Britain.

Albertsson, J., and Abrahams, S.C.; Atomic Displacement, Anharmonic Thermal Vibration, Expansivity and Pyroelectric Coefficient Thermal Dependences in ZnO; Acta Cryst.; 1989; pp. 34-40; vol. B45; International Union of Crystallography.

Blevins, J.D.; Wide Bandgap Semiconductor Substrates: Current Status and Future Trends.

Teke, A., Ozgur, U., Dogan, S., Gu, X., Morkoc, H., et al.; Excitonic fine structure and recombination dynamics in single-crystalline ZnO; Physical Review B; 2004; pp. 195207-1-195207-10; vol. 70; The American Physical Society.

Look, D.C., Reynolds, D.C., Litton, C.W., Jones, R.L., Eason, D.B., et al.; Characterization of homoepitaxial $p$-type ZnO grown by molecular beam epitaxy; Applied Physics Letters; Sep. 2, 2002; pp. 1830-1832; vol. 81, No. 10; American Institute of Physics.

Kim, K-K., Kim, H-S., Hwang, D-K., Lim, J-H., and Park, S-J.; Realization of $p$-type ZnO thin films via phosphorus doping and thermal activation of the dopant; Applied Physics Letters; Jul. 7, 2003; pp. 63-65; vol. 83, No. 1; American Institute of Physics.

Look, D.C.; Emerging Research Fonts Comments by David C. Look; ISI Essential Science Indicators; Apr. 28, 2005.

Senger, R.T., and Bajai, K.K.; Binding energies of excitons in polar quantum well heterostructures; Physical Review B; 2003; pp. 205314-1-205314-9; vol. 68; The American Physical Society.

Subramanyam, T.K., Naidu, B., and Uthanna, S.; Structure and Optical Properties of dc Reactive Magnetron Sputtered Zinc Oxide Films; Cryst. Res. Technol.; 1999; pp. 981-988; vol. 34.

Muth, J.F., Brown, J.D., Johnson, M.A.L, Yu, Z., Kolbas, R.M., et al.; Absorption coefficient and refractive index of GaN, AlN and AlGaN alloys; 1999; MRS Internet J. Nitride Semicond.

Yoshikawa, H., and Adachi, S.; Optical Constants of ZnO; Japanese Journal of Applied Physics; 1997; pp. 6237-6243; vol. 36.

Springer, J., Poruba, A., Vanecek, M., Fay, S., Feitknecht, Li., et al.; Improved optical model for thin film silicon solar cells; Presented at $17^{th}$ European Photovoltaic Solar Energy Conference, Munich 2001.

Neethling, J.H., Scriven, G.J., and Krekels, T.; A TEM investigation of $Zn_3As_2$ grown on (001) and (111) InP by MOVPE; Journal of Materials Science; 2001; pp. 3997-4002; vol. 36; Kluwer Academic Publishers.

Brink, D.J., and Engelbrecht, A.A.; Ellipsometric investigation of rough zinc arsenide epilayers; Applied Optics; Apr. 1, 2002; pp. 1894-1898; vol. 41, No. 10; Optical Society of America.

Scriven, G.J., Leitch, A.W.R., Neethling, J.H., Kozyrkov, V.V., and Watters, V.J.; The growth of $Zn_3As_2$ on InP by atmospheric pressure MOVPE; Journal of Crystal Growth; 1997; pp. 813-816; vol. 170; Elsevier Science B.V.

Engelbrecht, J.A.A., Scriven, G.J., Neethling, J.H., and Wagener, M.C.; Crack formation in $Zn_3As_2$ epilayers grown by MOVPE; Journal of Crystal Growth; 2000; pp. 235-244; vol. 216; Elsevier Science B.V.

Norman, A.G., Olson, J.M., Romero, M.J., and Al-Jassim, M.M.; Electron Microscopy Studies of Potential 1-eV Bandgap Semiconductor Compounds $AnGeAs_2$ and $Zn_3As_2$ Grown by MOVPE; National Renewable Energy Laboratory.

Miles, G.C., and West, A.R.; Polymorphism and Thermodynamic Stability of $Zn_7Ab_2O_{12}$; Journal of the American Ceramic Society; 2005; pp. 396-398; vol. 88.

Tomlins, G.W., Routbort, J.L., and Mason, T.O.; Oxygen Diffusion in Single-Crystal Zinc Oxide; Journal of the American Ceramic Society; 1998; pp. 869-876; vol. 81.

Botha, J.R., Scriven, G.J., Engelbrecth, J.A.A., and Leitch, A.W.R.; Photoluminescence properties of metalorganic vapor phase epitaxial $Zn_3As_2$; Journal of Applied Physics; Nov. 15, 1999; pp. 5614-5618; vol. 86, No. 10; American Institute of Physics.

Xiong, G., Wilkinson, J., Mischuck, B., Tuzemen, S., Ucer, K.B., et al.; Control of $p$-and $n$-type conductivity in sputter deposition of undoped ZnO; Applied Physics Letters; Feb. 18, 2002; pp. 1195-1197; vol. 80, No. 7; American Institute of Physics.

Look, D.C., Renlund, G.M., Burgener, II, R.H., and Sizelove, J.R.; As-doped p-type ZnO produced by an evaporation/sputtering process; Applied Physics Letters; Nov. 2004; vol. 85.

Aoki, T., Shimizu, Y., Miyake, A., Nakamura, A., Nakanishi, Y., and Hatanaka, Y.; p-Type ZnO Layer Formation by Excimer Laser Doping; phys. stat. sol.; 2002; pp. 911-914; vol. 229, No. 2; WILEY-VCh Verlag Berlin GmbH, Berlin.

Lee, J-M., Kim, K.K, Park, S-J., and Choi, W.K.; Low-resistance and non-alloyed ohmic contacts to plasma treated ZnO; Applied Physics Letters; Jun. 11, 2001; pp. 3842-2844; vol. 78, No. 24; American Institute of Physics.

Yamamoto, T.; Codoping Method to Realize Low-Resistivity $p$-type ZnO Thin Films; Asia Display/IDW '01, Oct. 16-19, 2001, Nagoya, Oct. 18, Phi-2.

Wang, L.G., and Zunger, A.; Cluster-Doping Approach for Wide-Gap Semiconductors: The Case of $p$-type ZnO; Physical Review Letters; Jun. 27, 2003; pp. 256401-1-256401-4; vol. 90, No. 25; the American Physical Society.

Nakahara, K., Takasu, H., Fons, P., Yamada, A., Iwata, K, et al.; Growth of N-doped and Ga+N-codoped ZnO films by radical source molecular beam epitaxy; Journal of Crystal Growth; 2002; pp. 503-508; vol. 237-239; Elsevier Science B.V.

Recnik, A., Daneu, N., Walther, T., and Mader, W.; Structure and Chemistry of Basal-Plane Inversion Boundaries in Antimony Oxide-Doped Zinc Oxide; Journal of the American Ceramic Society; 2001; pp. 2357-2668; vol. 84.

Nonaka, M., Matsushima, S., Mizuno, M., and Kobayashi, K.; Electronic Structure of Group III Elements Doped into ZnO by Using Molecular Orbital Calculation; Chemistry Letters; 2002; pp. 580-581; The Chemical Society of Japan.

Ryu, Y.R., Kim, W.J., and White, H.W.; Fabrication of homostructural ZnO p-n junctions; Journal of Crystal Growth; 2000; pp. 419-422; vol. 219; Elsevier Science B.V.

Lu, J., Ye, Z., Wang, L., Huang, J., and Zhao, B.; Structural, electrical and optical properties of N-doped ZnO films synthesized by SS-CVD; Materials Science in Semiconductor Processing; 2003; pp. 491-496; vol. 5; Elsevier Science Ltd.

Zhenguo, J., Kun, L., Chengxing, Y., Ruixin, F., and Zhizhen, Y.; Structural, optical and electrical properties of ZnO thin films prepared by reactive deposition; Journal of Crystal Growth; 2003; pp. 246-251; vol. 253; Elsevier Science B.V.

Ji, Z., Yang, C., Liu, K., and Ye, Z.; Fabrication and characterization of p-type ZnO films by pyrolysis of zinc-acetate—ammonia solution; Journal of Crystal Growth; 2003; pp. 239-242; vol. 253; Elsevier Science B.V.

Ye, Z-Z., Lu, J-G., Chen, H-H., Zhang, Y-Z., Wang, L, et al.; Preparation and characteristics of p-type ZnO films by DC reactive magnetron sputtenng; Journal of Crystal Growth; 2003; pp. 258-264; vol. 253; Elsevier Science B.V.

Minegishi, K., Koiwai, Y., Kikuchi, Y., Yano, K., Kasuga, M., et al.; Growth of p-type Zinc Oxide Films by Chemical Vapor Deposition; Japanese Journal of Applied Physics; 1997; pp. L 1453-L 1455; vol. 36.

Joseph, M., Tabata, H., and Kawai, T.; p-Type Electrical Conduction in ZnO Thin Films by Ga and N Codoping; Japanese Journal of Applied Physics; 1999; pp. L 1205-L 1207; vol. 38; Publication Board, Japanese Journal of Applied Physics.

Ashrafi, A.B.M.A., Suemune, I., Kumano, H., and Tanaka, S.; Nitrogen-Doped p-Type ZnO Layers Prepared with $H_2O$ Vapor-Assisted Metalorganic Molecular-Beam Epitaxy; Japanese Journal of Applied Physics; 2002; pp. L 1281-L 1284; vol. 41; The Japan Society of Applied Physics.

The Promise of Solid State Lighting for General Illumination: Light Emitting Diodes (LEDs) and Organic Light Emitting Diodes (OLEDs); 2001; pp. 1-29; Optoelectronics Industry Development Association, Washington, D.C.

Talbot, D.; LEDs vs. The Light Bulb; Technology Review; May 2003; pp. 30-36.

Johnson, S.; LEDs—An Overview of the State of the Art in Technology and Application; Light Right 5 Conference, May 27-31, 2002, Nice, France.

Tuzemen, S., Xiong, G., Wilkinson, J., Mischick, B., Ucer, K.B., et al.; Production and properties of p-n junctions in reactively sputtered ZnO; Physica B; 2001; pp. 1197-1200; vol. 308-310; Elsevier Science B.V.

Guo, X-L., Choi, J-H., Tabata, H., and Kawai, T.; Fabrication and Optoelectronic Properties of a Transparent ZnO Homostructural Light-Emitting Diode; Japanese Journal of Applied Physics; 2001; pp. L 177-L 180; vol. 40; The Japan Society of Applied Physics.

Jadwisienczak, W.M., Lozykowski, H.J., Xu, A., and Patel, B.; Visible Emission from ZnO Doped with Rare-Earth Ions; Journal of Electronic Materials; 2002; pp. 776-784; vol. 31.

Xiong, G. Wilkinson, J., Tuzemen, S., Ucer, K.B., and Williams, R.T.; Toward a new ultraviolet diode laser luminescence and p-n junctions in ZnO films.

Hoffman, R.L., Norris, B.J., and Wager, J.F.; ZnO-based transparent thin-film transistors; Applied Physics Letters; Feb. 3, 2003; pp. 733-735; vol. 82, No. 5; American Institute of Physics.

Bockowshi, M.; Growth and Doping of GaN and AlN Single Crystals under High Nitrogen Pressure; Cryst. Res. Technol.; 2001; pp. 771-787; Vol. 36;WILEY-VCH Verlag Berlin GmbH, Berlin.

Katayama-Yoshida, H., Sato, K, and Yamamoto, T.; Materials design for new functional semiconductors by *ab initio* electronic structure calculation: Prediction vs. experiment; JSAP International; Jul. 2006; pp. 20-27; No. 6.

Mukai, T., Morita, D., and Nakamura, S.; High-power UV InGaN/AlGaN double-heterostructure LEDs; Journal of Crystal Growth; 1998; pp. 778-781; vol. 189/190; Elsevier Science B.V.

Xing, H., Green, D.S., McCarthy, L., Smorchkova, I.P., Chavarkar, P., et al.; Progress in Gallium Nitride-based Bipolar Transistors.

Piprek, J., and Nakamura, S.; nano-Scale Effects in GaN-based Light-Emitting Diodes; 2004.

Piprek, J.; Simulation of GaN-based Light-Emitting Devices; 2004.

Bunea, G.E., Herzog, W.D., Unlu, M.S., Goldberg, B.B., and Molnar, R.J.; Time-resolved photoluminescence studies of free and donor-bound exciton in GaN grown by hydride vapor phase epitaxy.

Yao, T.; Plasma-Assisted MBE Growth of ZnO; Molecular Beam Epitaxy; pp. 98-105.

Chapter 2 Geometric Structure of Metal Oxides; pp. 55-58.

Chapter 4 Electronic Structure of Non-Transition-Metal-Oxide Surfaces; pp. 143-150.

Ip, K., Khanna, R., Norton, D.P., Pearton, S.J., Ren, F., et al.; Thermal Stability of Tungsten-Based Schottky Contacts to N-Type ZnO.

Look, D.C., Claflin, B., Alivov, Y.I., and Park, S.J.; the future of ZnO light emitters; phys. stat sol.; 2004.

Itani, Kenya, et al., "Low-Dislocation-Density GaAs Wafers Grown by Vertical Gradient Freeze Process, Suitable for Mass Production of Semiconductor Lasers," Hitachi Cable Review No. 20, Aug. 2001, pp. 35-38.

Pearton, S.J., et al. "Wide Band Gap Ferromagnetic Semiconductors and Oxides," Journal of Applied Physics vol. 93, No. 1, Jan. 1, 2003, pp. 1-13.

Web Page '99 SBIR Phase I . . . Topic 14—Electronic Materials http://www-ee.eng.buffalo.edu/faculty/paololin/492/semicon.pdf, "Low-Temperature Hydrothermal Growth of Zno for Seminconductor Substrates," Feb. 26, 2004, 2 pages.

Web Page "Semiconductor Photonics", 3 pages.

Renlund, Gary M., et al., "Silicon Oxycarbide Glasses: Part I. Preparation and Chemistry," J. Mater. Res. vol. 6, No. 12, Dec. 1991, pp. 2716-2722.

Renlund, Gary M., et al. "Silicon Oxycarbide Glasses: Part II. Structure and Properties," J. Mater. Res. vol. 6, No. 12, Dec. 1991, pp. 2723-2734.

* cited by examiner

PERSISTENT P-TYPE GROUP II-IV SEMICONDUCTORS

CROSS REFERENCE TO RELATED APPLICATION

This application claims the benefit of U.S. Provisional Application No. 60/580,454, filed Jun. 17, 2004, which application is incorporated by reference.

BACKGROUND OF THE INVENTION

The present invention relates to persistent p-type group II-VI semiconductor compounds, including fabrications methods and devices containing such compounds.

As used herein, the group II-VI semiconductor compounds include group II elements selected from zinc, cadmium, the alkaline earth metals such as beryllium, magnesium calcium, strontium, and barium, and mixtures thereof, and group VI elements selected from oxygen, sulfur, selenium, tellurium, and mixtures thereof. The group II-VI semiconductor compounds may be doped with one or more p-type dopant. Such p-type dopants include, but are not limited to, nitrogen, phosphorus, arsenic, antimony, bismuth, chalcogenides of the foregoing, and mixtures thereof. Zinc oxide and zinc sulfide are two presently preferred group II-VI semiconductor compounds.

Zinc oxide (ZnO) and zinc sulfide are wide band gap semiconductors with potential for use in electrically excited devices such as light emitting devices (LEDs), laser diodes (LDs), field effect transistors (FETs), photodetectors operating in the ultraviolet and at blue wavelengths of the visible spectrum, and other similar devices. Gallium nitride (GaN) and gallium arsenide (GaAs) are commonly used as a semiconductor material for the electronic devices mentioned above.

Zinc oxide has several advantages over GaN. For instance, ZnO exciton binding energy is 60 meV, which is about three times greater than GaN, and which suggests that ZnO-based lasers should have more efficient optical emission and detection. Zinc oxide drift mobility saturates at higher fields and higher values than GaN, potentially leading to higher frequency device performance. The cost and ease of manufacture of zinc oxide is attractive when compared to other common semiconductor materials. Zinc oxide has superior radiation-resistance (2 MeV at $1.2 \times 10^{17}$ electrons/cm$^2$) compared to GaN, which is desirable for radiation hardened electronics. Zinc oxide has high thermal conductivity (0.54 W/cm·K). Zinc oxide has strong two-photon absorption with high damage thresholds, rendering it ideal for optical power limiting devices. Zinc oxide forms two stable polytypes: wurtzite and zincblende; however, polytypism is not as prevalent as with GaN, AlN, and SiC.

N-type zinc oxide semiconductor materials are known and relatively easy to prepare, such as ZnO doped with aluminum, gallium, or other known n-type dopants. P-type zinc oxide semiconductor materials are theoretically possible, but have been difficult to prepare. D. C. Look et al., "The Future of ZnO Light Emitters," Phys. Stat. Sol., 2004, summarize data on p-type ZnO samples reported in the literature. The best reported ZnO samples have resistivity values of 0.5 ohm·cm (N/Ga dopants) and 0.6 ohm·cm (P dopant). Many of the reported p-type zinc oxide samples tend to be light, heat, oxygen, and moisture sensitive. Some convert to n-type material over time. Their stability has been questioned and instability has been observed. Some of the more-stable p-type zinc oxide materials reported in the literature are prepared using RF sputtering fabrication processes. No commercially viable p-type zinc oxide semiconductor materials are currently known.

Without being bound by theory, it is presently believed one possible explanation for the lack of p-type zinc oxide materials is because high temperature diffusion processes or other fabrication methods inhibit formation of desirable p-type zinc oxide compounds.

Fabrication temperature determines the effective limits for diffusion to be applicable in certain semiconductor systems. At low temperature the process is limited by slow diffusion, and when the temperature becomes sufficiently high for diffusion to occur, chemical reaction between the p-type dopant and oxygen forms stable gaseous species that make the p-type zinc oxide semiconductor structure unstable.

With reference to p-type zinc oxide, the p-type dopant may substitute for oxygen or substitute for zinc. If the dopant replaces oxygen, then it would be an anion, and if the dopant replaces zinc, it would be a cation. Referring to arsenic as the p-type dopant, there are two substitutional defects that are considered as the most probable ($As_O$) and ($As_{Zn}$). The notation "$As_O$" refers to an arsenic atom replacing an oxygen atom in the ZnO lattice. The notation "$As_{Zn}$" refers to an arsenic atom replacing a zinc atom. It is believed that both $As_O$ and $As_{Zn}$ result in the formation of complex crystal lattice coordination compounds that may include the formation of zinc vacancies on zinc sites, shown by the notation "$V_{Zn}$".

It has recently been suggested by researchers Sukit Limpijumnong et al. that large-size-mismatched zinc oxide dopants, such as arsenic and antimony, replace zinc in the crystal lattice, forming the complex $As_{Zn}$-$2V_{Zn}$. Sukit Limpijumnong et al., "Doping by Large-Size-Mismatched Impurities: The Microscopic Origin of Arsenic- or Antimony-Doped p-Type Zinc Oxide," Phys. Rev. Lett., Vol. 92, No. 15, Apr. 16, 2004. Based upon first-principles total energy calculations, these researchers concluded that it is "impossible for $As_O$ to dope ZnO efficiently p type."

Without being bound by theory, it is presently believed that stable, persistent, p-type group II-VI compounds are fabricated under conditions in which the p-type dopant, such as arsenic, substitutes for the group VI element, such as oxygen. Indeed, without being bound by theory, it is presently believed that the failure to prepare persistent p-type group II-VI compounds may often be explained because of the p-type dopant is doped into the compounds under conditions where it has a positive oxidation state (cation), replacing the group II element in the crystal lattice. Therefore, it would be an advancement in the art to provide persistent p-type group II-VI semiconductors generally, and persistent p-type zinc oxide specifically, and to provide fabrication methods and devices containing such compounds.

BRIEF SUMMARY OF THE INVENTION

The present invention is drawn to a persistent p-type group II-VI semiconductors, and to fabrication methods and devices containing such materials. The persistent p-type group II-VI semiconductor materials will typically comprise a single crystal group II-VI semiconductor which is doped with a p-type dopant that replaces atoms of the group VI elements in the semiconductor material. The p-type dopant has a negative oxidation state. The persistent p-type group II-VI semiconductor material is preferably fabricated under conditions which create vacancies of atoms of the group II elements in the semiconductor material. The persistent p-type group II-VI semiconductor material is preferably fabricated under conditions which inhibit formation of chemical bonds between atoms of group VI elements and the p-type dopant.

As used herein a persistent p-type semiconductor is not substantially degraded by UV or visible light exposure, exists at substantially room temperature and pressure, and retains its p-type semiconductor characteristic for an extended period of time, greater than one year. Depending upon the choice of group II-VI elements, the semiconductor material may also exhibit high temperature stability and radiation resistance. This is particularly relevant to zinc oxide semiconductors.

The dopant ion, once in the group II-VI structure is surprisingly stable and does not move through diffusion. Indeed, if diffusion were to occur, the structure would not be stable. Without being bound by theory, it is presently believed this is due to a bonding restriction that allows the p-type group II-VI semiconductor to form. In the case of arsenic as the p-type dopant and zinc oxide as the group II-VI material, there are no, or a limited number, of As—O bonds in the p-type arsenic-doped zinc oxide crystal lattice. If As—O bonds were to form, a low stability As—O compound would form that would render the zinc oxide structure less stable. Bonding restrictions of this kind are known in connection with carbon doping of silica. J. Mater. Res., Vol. 6, No. 12, December 1991.

While the foregoing discussion relates to arsenic doped zinc oxide, it is presently believed the bonding restrictions seen with As—O involve other group 5 oxides, and also include group 5 chalcogenides. Moreover, the invention includes the use of other p-type dopants, including, but not limited to nitrogen, phosphorus, antimony, and bismuth.

The high stability of the zinc oxide semiconductor devices allows them to be operated at higher temperatures, compared to conventional group III/V devices. Because the dopants are locked into the zinc oxide crystal structure, semiconductor devices containing engineered p-n junctions and engineered dopant concentration profiles provide improved stability at any given temperature. Such devices may survive high temperature excursion of 100° C. (during processing or use). This is particularly useful for field effect transistors and power devices.

Prior pending U.S. patent application Nos. 10/849,332, now U.S. Pat. No. 7,172,813, 10/849,345, now U.S. Pat. No. 7,161,173, 10/849,347, now U.S. Pat. No. 7,141,489, and 10/849,348, now U.S. Pat. No. 7,227,196, filed May 19, 2004, are incorporated by reference. These applications disclose methods and apparatus for the fabrication of p-type group II-VI semiconductors, p-type group II-VI semiconductor compounds, group II-VI semiconductor devices, and crystal growth substrates. The inventions disclosed in these prior patent applications may be adapted for use within the scope of the present invention.

The persistent group II-VI semiconductors within the scope of the present invention are typically fabricated as a thin film of a single crystal comprising atoms of group II elements, atoms of group VI elements, and one or more p-type dopants. The p-type dopant concentration is sufficient to provide the desired p-type semiconductor property in a single crystal form. Too much dopant may diminish desired electronic properties and inhibit single crystal formation. The semiconductor resistivity is less than about 0.5 ohm·cm, and preferably much lower. The carrier mobility is greater than about 0.1 cm$^2$/V·s, and preferably much greater. A persistent p-type group II-VI semiconductor material may be deposited as a thin film on an amorphous, polycrystalline, or crystalline self supporting substrate surface.

The group II elements include, but are not limited to, zinc, cadmium, alkaline earth metals, and mixtures thereof. The group VI elements include, but are not limited to, oxygen, sulfur, selenium, tellurium, and mixtures thereof. The p-type dopant includes, but is not limited to, nitrogen, phosphorus, arsenic, antimony, bismuth, and chalcogenides of the foregoing, and mixtures thereof. The p-type dopant concentration is in the range from about $10^{16}$ to about $10^{21}$ atoms/cm$^3$, and more preferably in the range from about $10^{17}$ to $10^{19}$ atoms/cm$^{-3}$.

BRIEF DESCRIPTION OF THE SEVERAL VIEWS OF THE DRAWINGS

A more particular description of the invention briefly described above will be rendered by reference to specific embodiments thereof which are illustrated in the appended drawings. These drawings depict only typical embodiments of the invention and are not therefore to be considered to be limiting of its scope. The invention will be described and explained with additional specificity and detail through the use of the accompanying drawings in which.

DETAILED DESCRIPTION OF THE INVENTION

The present invention is drawn to persistent group II-VI semiconductor materials. In particular, the present invention is drawn to p-type group II-VI semiconductor materials that may be fabricated under conditions in which a p-type dopant replaces the group VI element, such as oxygen or sulfur.

FIGS. 1-5 show zinc oxide ternary diagrams with selected p-type dopants, arsenic, antimony, phosphorous, bismuth, and nitrogen. These ternary diagrams share some common characteristics. For example, high stability binary compounds are formed along the Zn—O axis, along the Zn-dopant axis, and along the O-dopant axis. Compounds along the O-dopant axis are volatile. Ternary compounds are stable, but not volatile.

Figure 1:
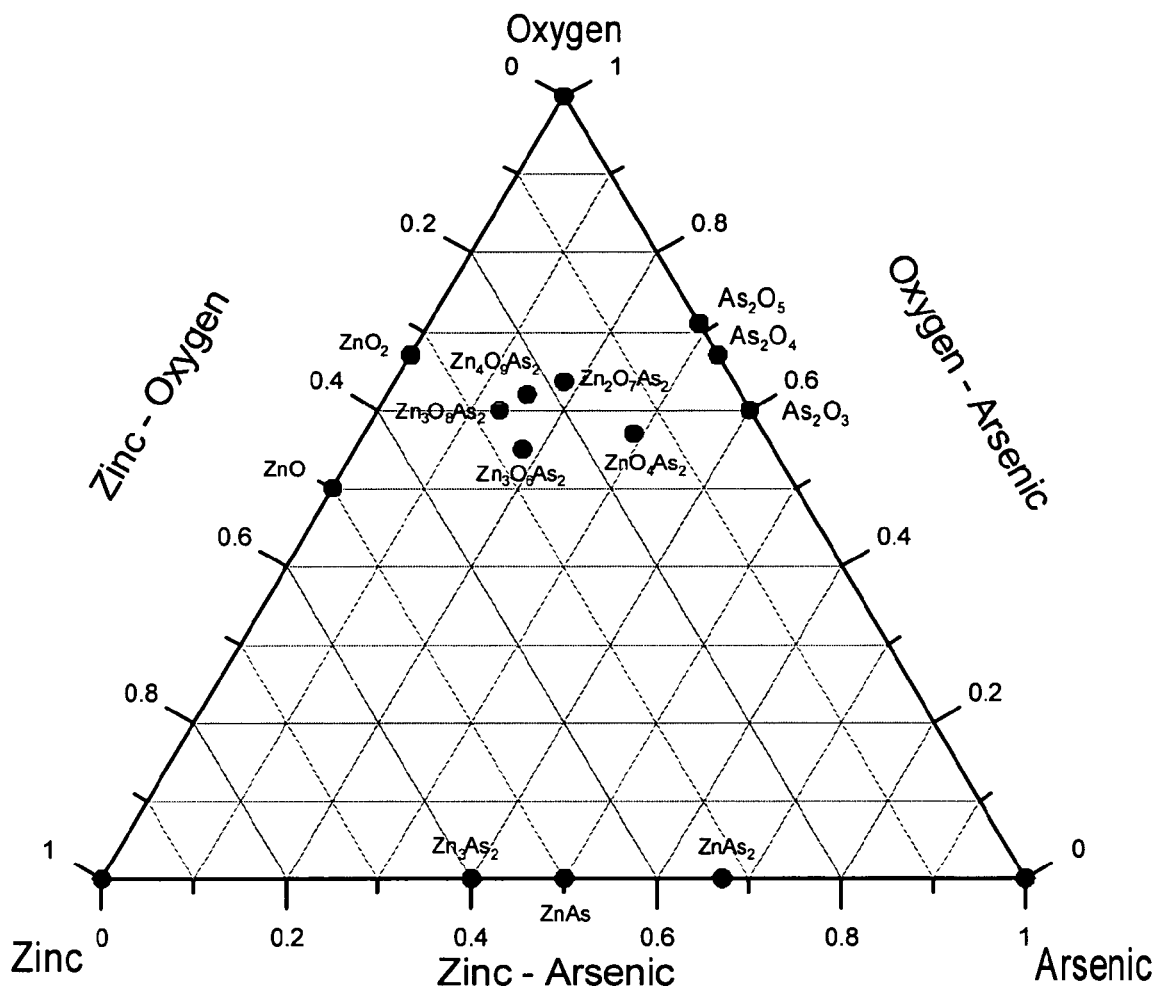
FIG. 1 shows a zinc-oxygen-arsenic ternary diagram.
Figure 2:
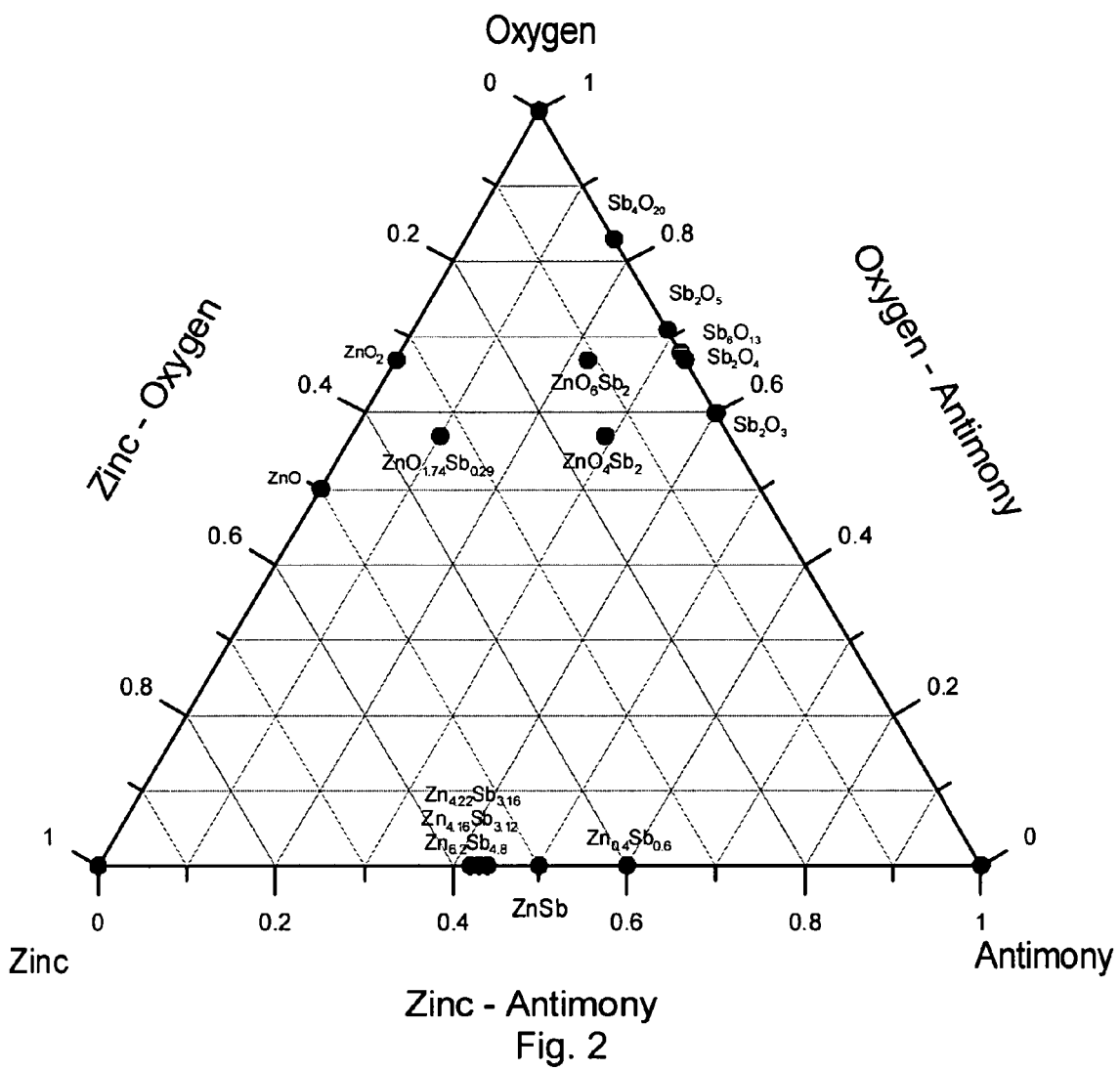
FIG. 2 shows a zinc-oxygen-antimony ternary diagram.
Figure 3:
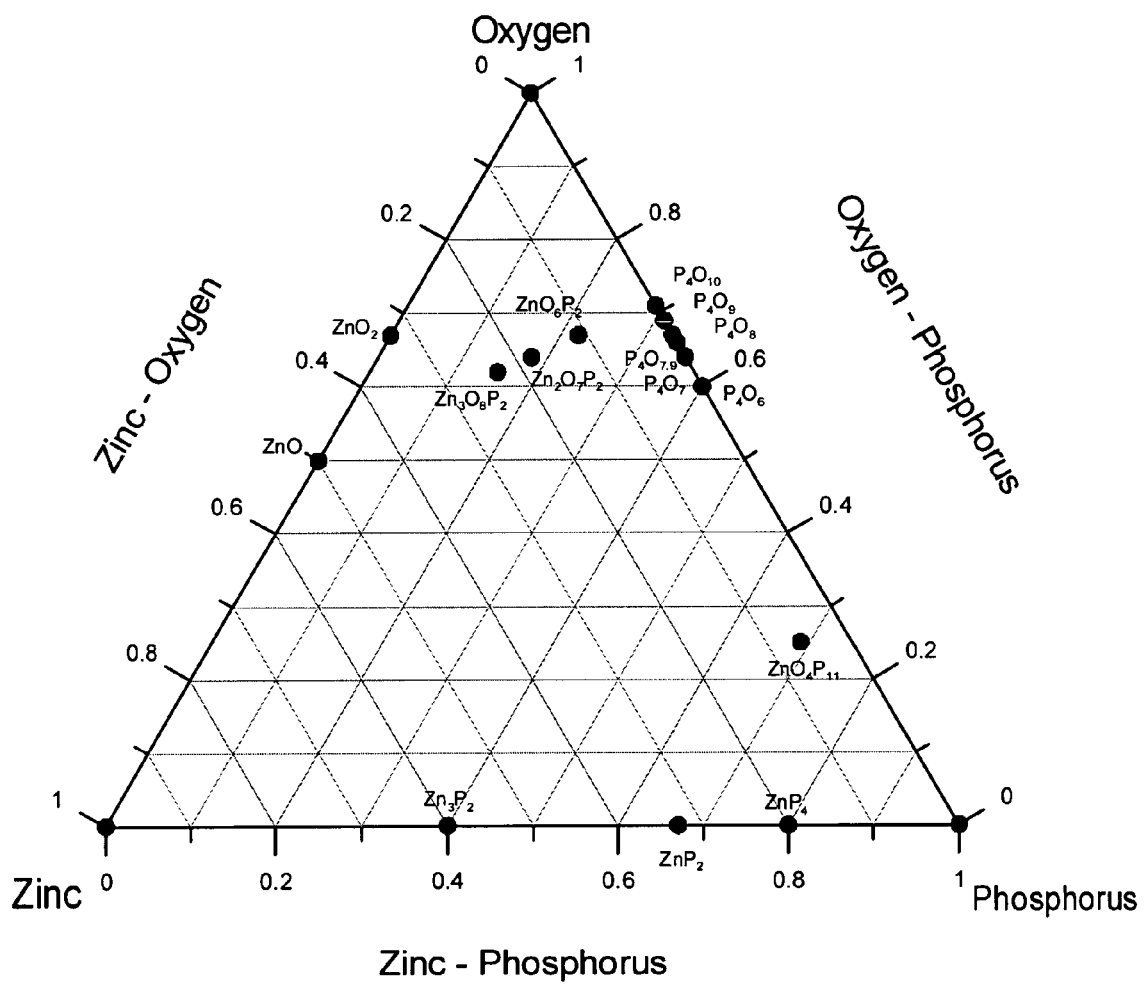
FIG. 3 shows a zinc-oxygen-phosphorous ternary diagram.
Figure 4:
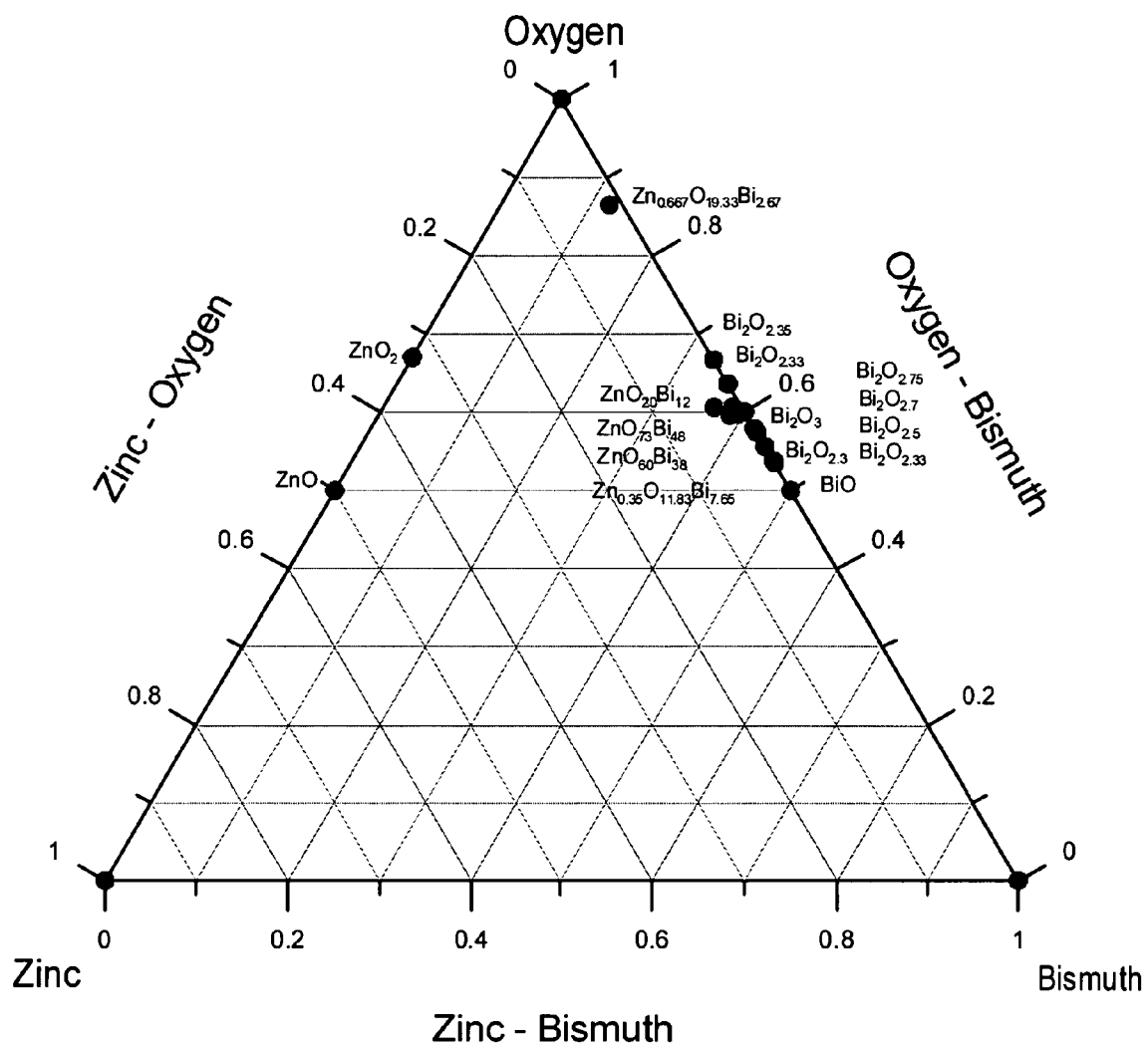
FIG. 4 shows a zinc-oxygen-bismuth ternary diagram.
Figure 5:
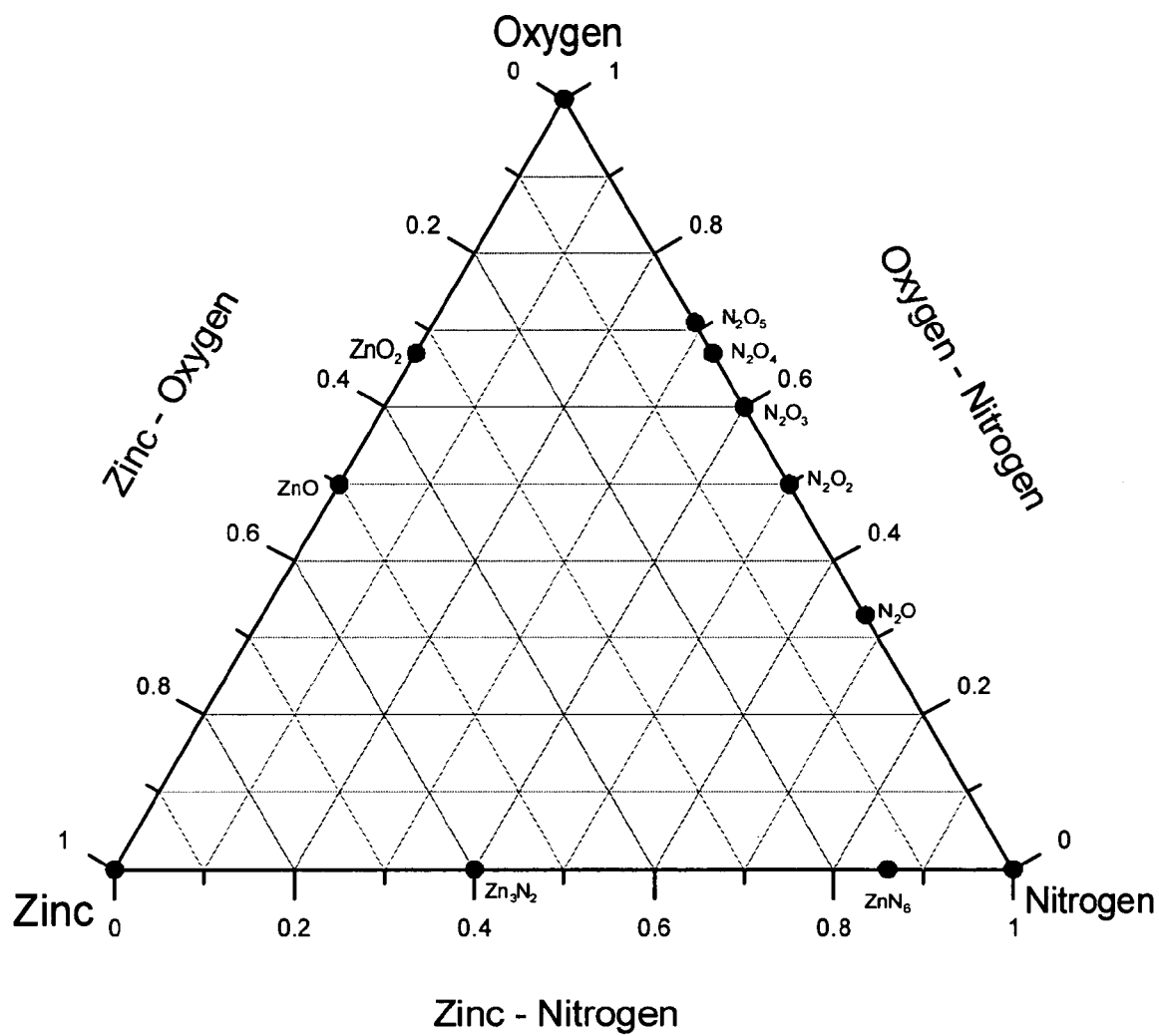
FIG. 5 shows a zinc-oxygen-nitrogen ternary diagram.

FIG. 1 shows a ternary diagram for the zinc-oxygen-arsenic system. In this system, there are unary compounds (zinc, oxygen, and arsenic (as $As_4$, $As_2$, $As_3$, and $As_1$)), binary compounds Zn—O ($ZnO$, $ZnO_2$), As—O ($As_2O_5$, $As_2O_4$, $As_2O_3$), and Zn—As ($Zn_3As_2$, $ZnAs$, $ZnAs_2$), and ternary compounds reported in the literature ($ZnO_4As_2$, $Zn_2O_7As_2$, $Zn_3O_6As_2$, $Zn_3O_8As_2$, and $Zn_4O_9As_2$).

Table 1 compares the stability of representative binary and ternary compounds.

TABLE 1

| Compound | $\Delta G_{f(500°\,C.)}$ (Kcal/mole) | Vapor Pressure @ 500° C. |
|---|---|---|
| Zn—O: ZnO | −113 | Low (2.8 × 10$^{-23}$ Bar) |
| As—O: $As_2O_3$ | −256 to −375 | High (4 Bar) |
| Zn—As: $Zn_3As_2$ | −26 | Low |
| $Zn_3O_8As_2$ | −474 | Low |

Table 1 shows that the As—O compounds are stable but volatile, whereas the other binary compounds have low vapor pressures. This is one reason As—O bonds (bonds between the dopant and the group VI element) should be avoided, because such As—O bonds may lead to the formation of stable, volatile species.

Table 2 reports the Gibbs energy of formation and vapor pressure for several compounds shown in FIGS. 1-5. This information corroborates the observation that high stability binary compounds are formed along the Zn—O axis and along the Zn-dopant axis, but that low stability binary compounds are formed along the O-dopant axis.

TABLE 2

| Compound | $\Delta G_{f(500° C.)}$ (Kcal/mole) | Vapor Pressure @ 500° C. |
|---|---|---|
| $Zn + O \leftrightarrow ZnO$ | −113 | $10^{-23}$ Bar |
| $N_2 + 2O_2 \leftrightarrow N_2O_4$ | −146 | 38 Bar |
| $3Zn + N_2 \leftrightarrow Zn_3N_2$ | +27 | Not in Database |
| $2P + 5O \leftrightarrow P_2O_5$ | −293 | N/A |
| $3Zn + 2P \leftrightarrow Zn_3P_2$ | −35 | Not in Database |
| $3Zn + 4O_2 + 2P \leftrightarrow Zn_3O_8P_2$ | −546 | Not in Database |
| $2As + 3O \leftrightarrow As_2O_3$ | −256 | 4 Bar |
| $3Zn + 2As \leftrightarrow Zn_3As_2$ | −26 | Not in Database |
| $3Zn + 4O_2 + 2As \leftrightarrow Zn_3O_8As_2$ | −376 | Not in Database |
| $Sb + O \leftrightarrow SbO$ | −266 | Not in Database |
| $Zn + Sb \leftrightarrow ZnSb$ | −3.5 | Not in Database |

Figure 6:
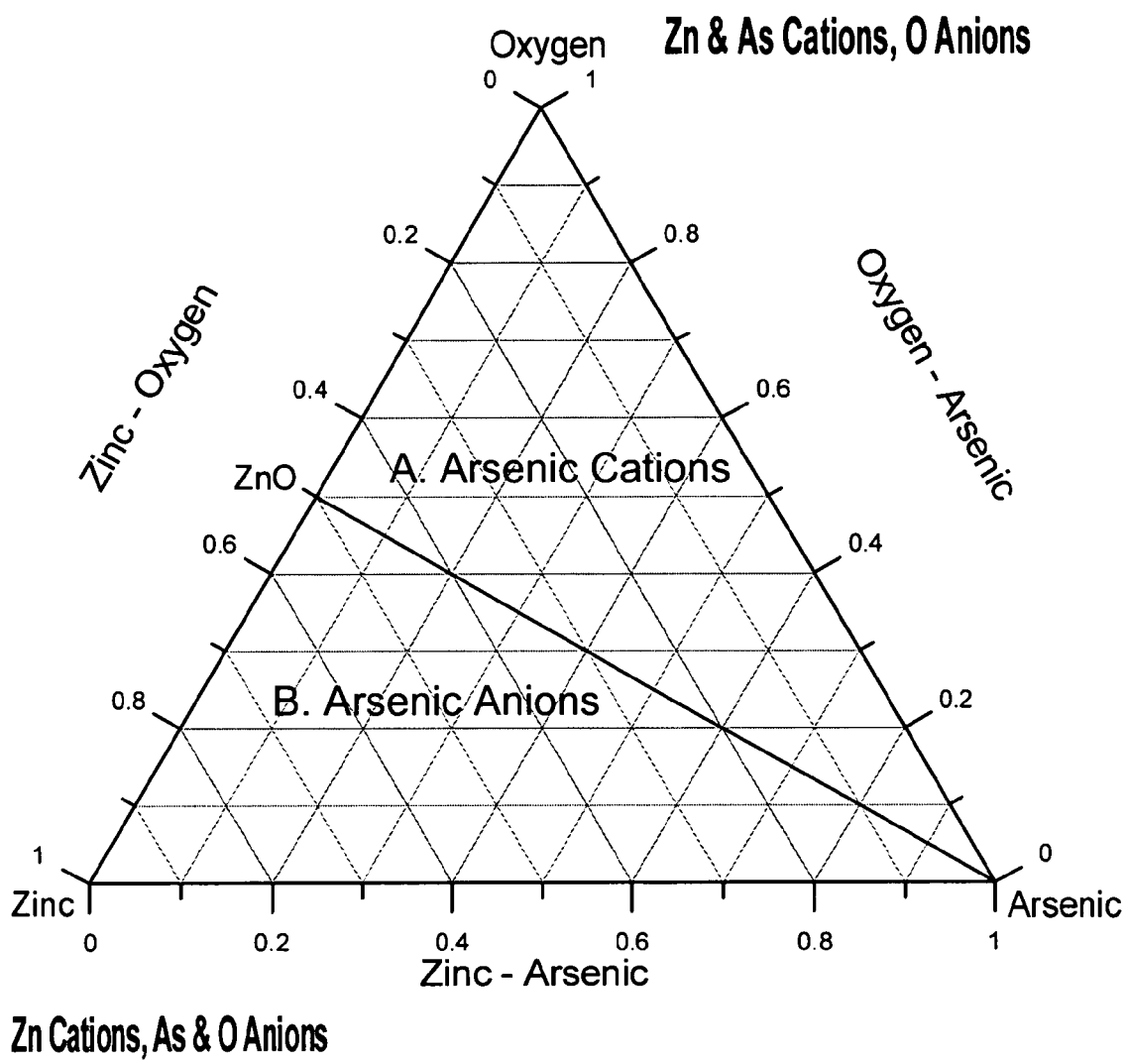
FIG. 6 shows a zinc-oxygen-arsenic ternary diagram with regions identified where arsenic is a cation and where arsenic is an anion.

Arsenic takes on the characteristics of an anion or cation depending on the composition. FIG. 6 shows a zinc-oxygen-arsenic ternary diagram identifying the region where arsenic has a positive oxidation state, or behaves as a cation (A), and the region where arsenic has a negative oxidation state, or behaves as an anion (B). When one compares FIG. 1 and FIG. 6, the known ternary compounds all lie within the region where arsenic takes on the characteristics of a cation. There are no reported ternary compounds where arsenic has a negative oxidation state. However, the compounds $Zn_3As_2$, ZnAs, and $ZnAs_2$ are known, commercially available compounds in which arsenic has a negative oxidation state.

Figure 7:
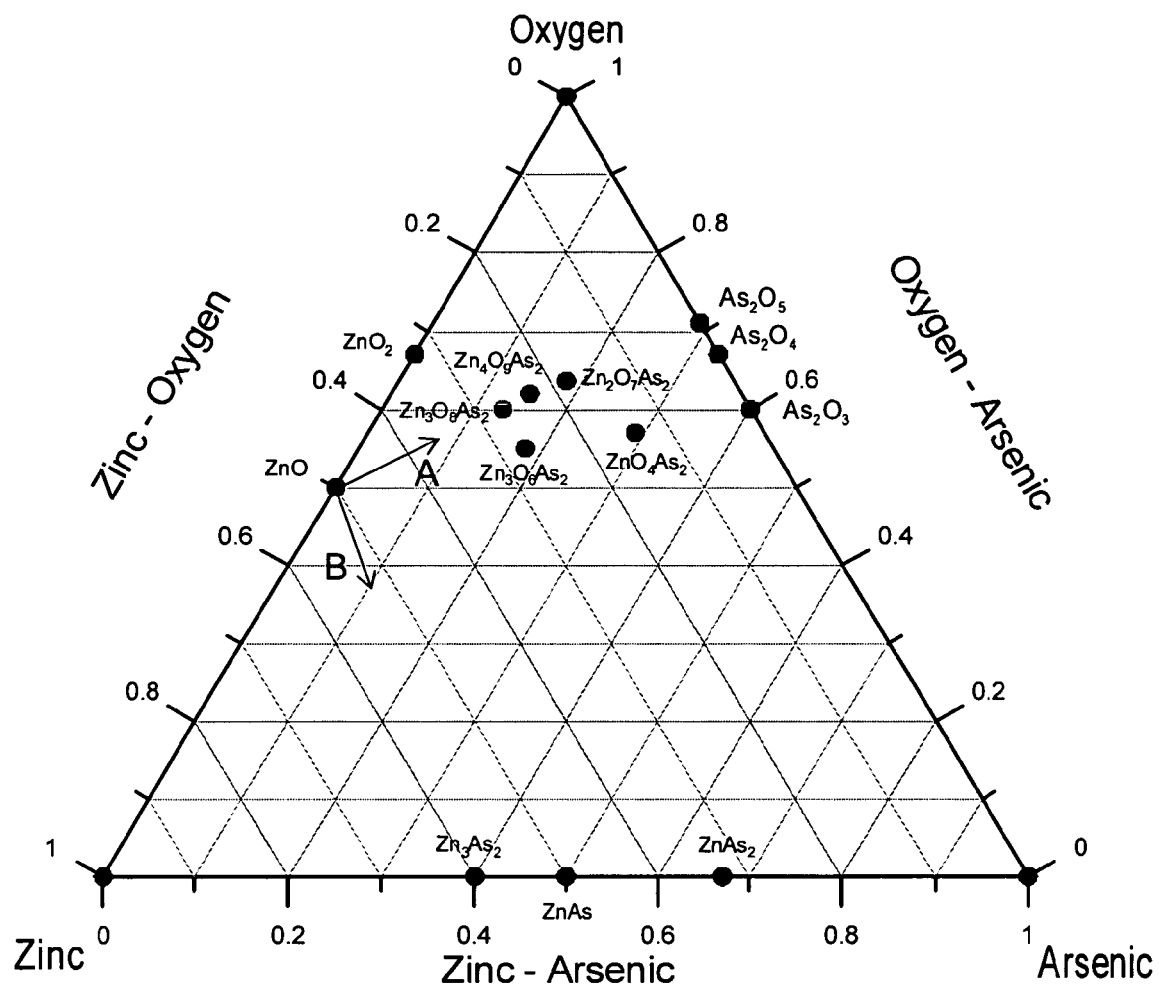
FIG. 7 shows a zinc-oxygen-arsenic ternary diagram with lines A and B.

FIG. 7 is a zinc-oxygen-arsenic ternary diagram which includes lines A and B. Line A represents a dopant structure in zinc oxide in which arsenic substitutes for zinc ($As_{Zn}$). The general formula of certain compounds along Line A, assuming 2 unit cells, is represented by Equation (1), for integers n=0, 1, 2, 3, and 4:

(1)

Such dopant structures lie on a line between ZnO and $As_2O_5$. In such compounds, the arsenic has a +5 oxidation state. An alternative equation may be developed to predict dopant structures that lie on a line between ZnO and $As_2O_3$, represented by Equation (1a), for integers n=0, 1, 2, 3, and 4:

(1a)

In such compounds, the arsenic has a +3 oxidation state. Other similar equations may be developed to predict possible dopant structures that lie on a line between ZnO and $As_2O_4$, in which the arsenic has a +4 oxidation state. In such compounds, one arsenic atom would theoretically replace two zinc atoms.

Line B represents a dopant structure in zinc oxide in which arsenic substitutes for oxygen ($As_O$). The general formula of certain compounds along Line B, assuming 2 unit cells, is represented by Equation (2), for integers n=0, 1, 2, 3, and 4, and assuming that the oxidation states of zinc, oxygen, and arsenic are $Zn^{+2}$, $O^{-2}$, and $As^{-3}$, then:

(2)

Such dopant structures lie on a line between ZnO and $Zn_3As_2$. In such compounds, the arsenic has a −3 oxidation state. Alternative equations may be developed to predict dopant structures that lie on a line between ZnO and $Zn_3As_2$, such as Equation (2a), for integers n=0, 1, 2, 3, and 4:

(2a)

It will be appreciated that the foregoing equations can be generalized by replacing the As with X, where X represents a group 5 dopant selected from N, P, As, Sb, and Bi.

Similar equations may be developed to predict compounds that lie on a line between ZnO and ZnAs. In such compounds, the arsenic has a −2 oxidation state. Likewise, equations may be developed to predict compounds that lie on a line between ZnO and $ZnAs_2$. In such compounds, the arsenic has a −1 oxidation state.

Lines A and B are intended to indicate general direction away from the ZnO composition. Nothing is to be implied from the extent of the lines because semiconducting compositions will lie very close to the point composition, ZnO. Typical dopant concentrations in the semiconductor materials will be between $10^{16}$ and $10^{21}$ atoms/cm$^3$. These concentrations are so low that they appear to lie on the zinc-oxygen axis. Likewise, nothing is to be implied from the specific direction of the lines, other than line A extends into region A, shown on FIG. 6, and line B extends into region B, shown on FIG. 6.

Solving Equations (1), (1a), (2), and (2a) for n=0, 1, 2, 3, and 4, yields the following compounds:

TABLE 3

| | Equation (1) | Equation (1a) | Equation (2) | Equation (2a) |
|---|---|---|---|---|
| n = 0: | $[Zn_4O_4]$ | $[Zn_4O_4]$ | $[Zn_4O_4]$ | $[Zn_{12}O_{12}]$ |
| n = 1: | $[Zn_3O_8As_2]$ | $[Zn_3O_6As_2]$ | $[Zn_{4.5}O_3As]$ | $[Zn_{12}O_9As_2]$ |
| n = 2: | $[Zn_2O_{12}As_4]$ | $[Zn_2O_8As_4]$ | $[Zn_5O_2As_2]$ | $[Zn_{12}O_6As_4]$ |
| n = 3: | $[ZnO_{16}As_6]$ | $[ZnO_{10}As_6]$ | $[Zn_{5.5}OAs_3]$ | $[Zn_{12}O_3As_6]$ |
| n = 4: | $[O_{20}As_8]$ | $[O_{12}As_8]$ | $[Zn_6As_4]$ | $[Zn_{12}As_8]$ |

Without being bound by theory, it is presently believed that the p-type character of arsenic doped zinc oxide results from compounds in which the arsenic has a negative oxidation state and replaces oxygen in the zinc oxide crystal structure. Such dopant compounds will be of the type represented by Equations (2) and (2a) and not Equations (1) and (1a). Unusual stability of arsenic has been observed in the zinc oxide wurtzite structure.

Experimental analysis of persistent p-type zinc oxide had yielded evidence of zinc vacancies ($V_{Zn}$) in the crystal lattice. There are at least two theories explain the presence of zinc vacancies in the p-type zinc oxide: (1) the dopant atoms replace a greater number of group VI atoms or (2) the oxidation state of the dopant is reduced.

One possible example of the dopant atoms replacing more than a stoichiometric amount of group VI atoms to produce zinc vacancies is shown in Equation (3) as follows:

(3)

Solving Equation (3) for n=0, 1, 2, and 3 yields the compounds, shown in Table 4.

TABLE 4

| | Equation (3) |
|---|---|
| n = 0: | $[Zn_8O_8]$ |
| n = 1: | $[Zn_8O_{5.5}As] + 1[V_{Zn}]$ |
| n = 2: | $[Zn_8O_3As_2] + 2[V_{Zn}]$ |
| n = 3: | $[Zn_8O_{0.5}As_3] + 3[V_{Zn}]$ |

It will be appreciated that other similar equations may be developed to explain the formation of zinc vacancies as the zinc oxide is doped under the conditions described herein.

One possible example of the dopant oxidation state changing to produce zinc vacancies is represented by the following equation:

$$[Zn_5O_2As_2] \rightarrow [Zn_5O_2As_2] + [V_{Zn}] \text{ as } As^{-3} \rightarrow As^{-2}$$

In this example, if certain atoms of the arsenic dopant are reduced from a $-3$ to a $-2$ oxidation state, then a zinc vacancy is formed to balance the charge of the resulting crystal structure.

It will be appreciated that other theoretical examples may be developed to explain the formation of zinc vacancies as the dopant oxidation state is reduced within the resulting crystal structure.

The location of the arsenic dopant acceptor composition point in the zinc-oxygen-arsenic ternary diagram has traditionally been made by assuming diffusion of components is possible, all bonding combinations are possible, and the Gibbs phase rule applies. If these traditional assumptions are made, then the composition is a point lying very close to the compositional point ZnO on the ternary diagram. If the arsenic dopant is present at a concentration of about $10^{20}$ atoms/cm$^3$, then the dopant composition lies at the coordinates: $[ZnO_{(0.99983)} As_{(1.661 \times 10^{-4})}]$.

According to the present invention, the foregoing assumptions do not apply. Under the coordination assignment approach within the scope of the present invention, the dopant acceptor is a complex coordination compound. More specifically, the coordination composition is believed to be a compound similar to the compounds that satisfy Equation (2). Assuming for the purpose of discussion that the acceptor is $[Zn_{4.5}O_3As]$ and the arsenic dopant is present at a concentration of about $10^{20}$ atoms/cm$^3$. If the coordination assignment of the composition point $10^{20}$ [As] ions cm$^{-3}$=X, then the coordination composition can be represented by:

$$(1-X)[Zn_4O_4] + (X)[Zn_{4.5}O_3As] = 1$$

This point lies at coordinates:

$$(0.99983) \times [Zn_4O_4] + (1.661 \times 10^{-4}) \times [Zn_{4.5}O_3As] = 1$$

Under this theory, Gibbs phase rule does not apply, bonding combinations are restricted, and diffusion of components is not possible. Because arsenic substitutes for oxygen as an anion, the p-type zinc oxide compounds are preferably fabricated in a low partial pressure of oxygen and low temperature. Otherwise arsenic would tend to oxidize to form a cation. The arsenic substitution creates a stable, complex dopant/carrier site, (As$_O$). It is not a simple replacement of oxygen in the zinc oxide crystal lattice, but a complex replacement involving lattice vacancies. Because of the complex lattice structure, steric hindrance between atoms and the molecular bonds limits diffusional processes. Thus, diffusion is not used to create p-type zinc oxides and p/n junctions. Instead, a dynamic growth process, not a diffusional process, is used to fabricate p-type zinc oxides and p-n junctions.

Upon considering the arsenic local environment of arsenic acceptor sites (As$_O$) in a zinc oxide unit cell [Zn$_2$O$_2$] with a volume=47.491 Å$^3$, two unit cells accommodate this effect [Zn$_4$O$_4$], which give the following possible coordinations:

| n = 0: | Zn—(O)$_4$ |
| n = 1: | As—Zn—(O)$_3$ |
| n = 2: | (As)$_2$—Zn—(O)$_2$ |
| n = 3: | (As)$_3$—Zn—O |
| n = 4: | Zn—(As)$_4$ |

Such coordinations require low oxygen concentration to suppress the formation of [O—As] bonding. Gibbs phase rule does not apply because diffusion is not permitted. In addition, there are bonding restrictions in [Zn—O—As] ternary compounds within the scope of the present invention; specifically, there are no, or a limited number of [As—O] bonds. The bonding restrictions are summarized below:

Zinc bonding Scheme

| 1. | [ZnO] in a wurtzite structure |
| 2. | [O$_3$—Zn—As$_1$] |
| 3. | [O$_2$—Zn—As$_2$] |
| 4. | [O$_1$—Zn—As$_3$] |
| 5. | [ZnAs] in an orthorhombic structure |

Oxygen bonding Scheme

| 1. | O—(Zn)$_4$ tetrahedra |

Arsenic bonding Scheme

| 1. | As—(Zn)$_3$ in an orthorhombic structure |

Knowing the composition and coordination of the structures that produce p-type and n-type electrical behavior, one skilled in the art can engineer or design chemical precursors for use in MOCVD processes. This involves knowledge and consideration of optimization of dopant concentrations and chemistries; chemical synthesis of the precursor compounds; characterization of precursors; and pyrolysis reactions.

While some of the discussion herein mentions zinc oxide specifically, it will be appreciated that the assumptions and principles discussed above in relation to p-type doped zinc oxide apply to other Group II-VI compounds, including by not limited to group II oxides besides zinc oxide, such as BeO, MgO, CaO, and CdO, and other compounds such as zinc sulfide.

Prior pending U.S. patent application Nos. 10/849,347, now U.S. Pat. No. 7,141,489, 10/849,345, now U.S. Pat. No. 7,161,173, and 10/849,348, now U.S. Pat. No. 7,227,196, which were incorporated by reference above, disclose numerous methods and apparatus for the fabrication of p-type group II-VI semiconductors, p-type group II-VI semiconductor compounds, and group II-VI semiconductor devices. Various chemical deposition processes may be used to prepare persistent p-type group II-VI semiconductor compound and devices including, but not limited to, RF sputtering, MBE (molecular beam epitaxy), CVD (chemical vapor deposition), MOCVD (metal organic chemical vapor deposition), and other thin film crystal growth techniques.

In one disclosed method, a p-type group II-VI semiconductor material is fabricated by obtaining a self supporting substrate surface and depositing a thin film of group II-VI semiconductor doped with one or more p-type dopants on the substrate surface. The deposition conditions are controlled such that the group II, group VI, and p-type dopant atoms are in a gaseous phase prior to combining as the thin film of group II-VI semiconductor.

The group II-VI semiconductor may be deposited as a thin film on self supporting substrates known in the art such as sapphire and silicon carbide. However, the semiconductor materials need not be deposited on expensive crystal growth substrates. Instead, they may advantageously be deposited on lower cost crystalline, polycrystalline, and amorphous substrates. Such substrates may include, but are not limited to, silicon wafers, amorphous self supporting substrate surfaces like fused silica and glasses such as borosilicate glass, and polycrystalline substrate surfaces such as alumina. The group II-VI semiconductor materials may be deposited on many other substrates. The choice of substrate may be affected by the desired application of the semiconductor, including transparency, electronic properties, and cost.

The p-type dopant concentration in the group II-VI semiconductor is preferably greater than about $10^{16}$ atoms/cm$^{-3}$, and typically in the range from about $10^{16}$ to about $10^{21}$ atoms/cm$^{-3}$. More preferably, the p-type dopant concentration is in the range from about $10^{17}$ to $10^{19}$ atoms/cm$^{-3}$. The dopant content in the resulting group II-VI material may be varied and controlled. High dopant content is possible using techniques within the scope of the present invention.

The semiconductor resistivity is preferably less than about 0.5 ohm·cm. More preferably the resistivity is less than about 0.1 ohm·cm, more preferably the resistivity is less than about 0.01 ohm·cm, and more preferably the resistivity is less than about 0.001 ohm·cm.

The carrier mobility is preferably greater than about 0.1 cm$^2$/V·s. More preferably, the carrier mobility is greater than 0.5 cm$^2$/V·s, and more preferably the carrier mobility is greater than 4 cm$^2$/V·s. Carrier mobilities greater than 100 cm$^2$/V·s have been observed.

The group II-VI semiconductor material is preferably deposited as a single crystal. As used herein, a single crystal group II-VI semiconductor material possesses a single predominant reflection on an X-ray diffraction pattern. Polycrystalline materials will possess multiple reflection peaks on an X-ray diffraction pattern. Persons skilled in the art will appreciate that a perfect single crystal, defect free, does not exist. There will always be some minor crystal defects present. As used herein, a single predominant reflection peak will possess at least 95% of the integrated area of the X-ray diffraction pattern, and more preferably greater than 99%.

The band gap of the group II-VI semiconductor may be controlled by including additional dopant or alloy compounds including, but not limited to, cadmium oxide and magnesium oxide, which are themselves group II-VI compounds. As an example, zinc oxide host has a band gap of about 3.2 eV. The zinc oxide band gap may be modified using known band gap engineering techniques. By varying the host material, the light emission wavelength may be adjusted. Zinc oxide alloyed with magnesium oxide may increase the band gap to about 4.0 eV which will result in a light emission of about 310 nm. Similarly, cadmium oxide alloyed with zinc oxide, alone or in combination with other cadmium chalcogenides, may decrease the band gap which will result in a light emission in the visible region. The amount of magnesium oxide or cadmium oxide will typically range up to about 20 to 40 mole % to achieve a desired band gap or other electronic properties. The maximum MgO or CdO concentration is the solubility of MgO and CdO within the zinc oxide wurtzite structure. If too much MgO or CdO is doped added to zinc oxide a second phase appears and/or the material becomes poly-crystalline or amorphous.

There are many potential applications and uses of the p-type group II-VI semiconductor materials, and in particular zinc oxide and zinc sulfide semiconductor materials. For example, it may be combined with a suitable n-type semiconductor material to form a p-n junction used in various electrical components. The n-type semiconductor is preferably compatible with the p-type group II-VI semiconductor and preferably contains an n-type dopant selected from known dopant materials. Typical n-type dopants include, but are not limited to, ions of Al, Ga, B, H, Yb and other rare earth elements, Y, Sc, and mixtures thereof. It may be used to prepare light emitting devices that produce light ranging from the ultraviolet into the visible region under an electric potential. Band gap engineering principles can be used to control the light emitted. Ultraviolet light can be used to photopump phosphors and produce visible white light. The low activation energy would permit the light emitting devices to operate at low voltage. The p-type group II-VI semiconductor materials may be used to prepare ultraviolet laser diodes. Just as the thin film may be configured to generate light under an electric potential, the devices may be used as a photovoltaic solar cell to generate electricity when exposed to light or a photodetector device.

The electrical conductivity of the thin films renders them useful in flat-panel display devices. The zinc oxide thin films may be used in electrochromic devices, such as automatically dimming rear-view mirrors for automobiles and electrically controlled "smart" windows. Electric current may be passed through the thin films coated on vehicle windows and freezer display cases to render them frost-free. The thin film conductivity may be exploited to dissipate static electricity from windows on photocopy machines, to form transparent electromagnetic shields, invisible circuits on windows, and transparent radio antennas built into automobile windows. The high thermal and chemical stability of zinc oxide may render radiation hardened electrical components.

Solid state devices may be fabricated containing a p-type group II-VI semiconductor material, an n-type group II-VI semiconductor material, and a p-n junction disposed between the p-type and n-type semiconductor materials.

Single or multiple quantum well (MQW) heterostructures may be fabricated to render the p/n junction more efficient. A single quantum well is made of two alternating semiconductor materials. One layer is a barrier layer defined by a higher band gap than the second layer. The second layer's band gap defines the bottom of the quantum well. For example, MgO may be alloyed with ZnO to form the barrier layer, and the undoped ZnO will define the bottom of the well. This produces a more efficient device and raises the band edge. Conversely, CdO may be alloyed with ZnO to define the bottom layer of the quantum well, and the undoped ZnO defines the barrier layer. This produces a more efficient device and lowers the band edge.

An additional advantage of a quantum well is that the layers can be mechanically strained to raise or lower the band edge. Mechanical strain may exist if the two layers have slightly different crystal lattice constants. For most zinc oxide materials the band edge is around 390 nm, but some of the zinc oxide semiconductor materials fabricated in accordance with the present invention had a band edge of about 370 nm.

The number of quantum wells may vary. Good results may be obtained with just one quantum well. Typically the number of quantum wells may range from about 1 to 20, and more preferably from about 3 to 7 quantum wells. The total thickness of the quantum well alternating layers must in the vicinity of, or less than, the electron de Broglie wavelength (100 Å). These heterostructures may be fabricated through a chemical deposition process, including but not limited to those described above, such as sputtering, CVD, MOCVD, MBE, etc.

For example, one possible MQW configuration for use in connection with zinc oxide semiconductor structure may include alternating layers of ZnO (20 Å-100 Å) and $Cd_xZn_{1-x}O$ (10 Å-25 Å). The cadmium content may be varied. The amount of cadmium in the cadmium zinc oxide alloy may vary depending on the desired shifting of the band gap. In one illustrative embodiment, the cadmium content may range from about 1 to 20 mole %, and more typically about 10 mole %. The cadmium zinc oxide alloy may be replaced with a magnesium zinc oxide alloy of the general formula $Mg_xZn_{(1-x)}O$.

It will be appreciated that the present invention provides persistent group II-VI semiconductor materials that include p-type dopants. The p-type dopant replaces atoms of the group VI elements in the semiconductor material under conditions which inhibit formation of chemical bonds between atoms of group VI elements and the p-type dopant. The p-type dopant has a negative oxidation state. The p-type dopant creates vacancies of atoms of the group II elements in the semiconductor material. The resulting semiconductor materials exhibit good electronic and physical properties.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

The invention claimed is:

1. A persistent p-type group II-VI semiconductor material comprising a thin film of a single crystal group II-VI semiconductor comprising atoms of group II elements and atoms of group VI elements, wherein the group II-VI semiconductor is doped with a p-type dopant to form one or more ternary compounds:, and wherein the single crystal group II-VI semiconductor has a crystal lattice comprising vacancies of atoms of the group II elements, wherein the p-type dopant replaces atoms of the group VI elements in the semiconductor material under conditions which inhibit formation of chemical bonds between atoms of group VI elements and the p-type dopant and inhibit the formation of volatile reaction products of the group VI elements and the p-type dopant, wherein the group II-VI semiconductor is doped with a p-type dopant at a temperature below about 450° C.

2. A persistent p-type group II-VI semiconductor material according to claim 1, wherein the p-type dopant has a negative oxidation state.

3. A persistent p-type group II-VI semiconductor material according to claim 1, wherein the group II elements are selected from zinc, cadmium, alkaline earth metals, and mixtures thereof.

4. A persistent p-type group II-VI semiconductor material according to claim 1, wherein the group VI elements are selected from oxygen, sulfur, selenium, tellurium, and mixtures thereof.

5. A persistent p-type group II-VI semiconductor material according to claim 1, wherein the p-type dopant is selected from nitrogen, phosphorus, arsenic, antimony, bismuth, chalcogenides of the foregoing, and mixtures thereof.

6. A persistent p-type group II-VI semiconductor material according to claim 1, wherein the group II-VI semiconductor material is zinc oxide.

7. A persistent p-type group II-VI semiconductor material according to claim 1, wherein the group II-VI semiconductor material is zinc sulfide.

8. A persistent p-type group II-VI semiconductor material according to claim 1, wherein the group II-VI semiconductor material is in a single crystal form having a resistivity less than about 0.5 ohm·cm and a carrier mobility greater than about 0.1 $cm^2/V·s$.

9. A persistent p-type group II-VI semiconductor material according to claim 1, wherein the resistivity is less than about 0.1 ohm·cm.

10. A persistent p-type group II-VI semiconductor material according to claim 1, wherein the resistivity is less than about 0.01 ohm·cm.

11. A persistent p-type group II-VI semiconductor material according to claim 1, wherein the resistivity is less than about 0.001 ohm·cm.

12. A persistent p-type group II-VI semiconductor material according to claim 1, wherein the carrier mobility is greater than 0.5 $cm^2/V·s$.

13. A persistent p-type group II-VI semiconductor material according to claim 1, wherein the carrier mobility is greater than 4 $cm^2/V·s$.

14. A persistent p-type group II-VI semiconductor material according to claim 1, wherein the p-type dopant concentration is in the range from about $10^{16}$ to $10^{21}$ atoms/$cm^3$.

15. A persistent p-type group II-VI semiconductor material according to claim 1, wherein the p-type dopant concentration is in the range from about $10^{17}$ to $10^{19}$ atoms/$cm^{-3}$.

16. A persistent p-type group II-VI semiconductor material according to claim 1, wherein the semiconductor material is embodied with a solid state device selected from light emitting diodes, laser diodes, field effect transistors, photodetectors, electrochromic devices, flat-panel display devices, and radiation hardened electrical components.

17. A persistent p-type group II-VI semiconductor material according to claim 1, further comprising magnesium oxide.

18. A persistent p-type group II-VI semiconductor material according to claim 1, further comprises cadmium oxide.

19. A persistent p-type group II-VI semiconductor material according to claim 1, wherein vacancies of atoms of the group II elements exist because atoms of the p-type dopant replace a greater number of group VI atoms in the ternary compound.

20. A persistent p-type group II-VI semiconductor material according to claim 1, the oxidation state of the p-type dopant of the ternary compound.

* * * * *